United States Patent
Lee et al.

(10) Patent No.: US 12,051,461 B2
(45) Date of Patent: Jul. 30, 2024

(54) BIT LINE SENSE AMPLIFIER AND SEMICONDUCTOR MEMORY DEVICE HAVING THE SAME

(71) Applicant: SAMSUNG ELECTRONICS CO., LTD., Suwon-si (KR)

(72) Inventors: Hoseok Lee, Suwon-si (KR); Sunyoung Kim, Seoul (KR); Younghun Seo, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 48 days.

(21) Appl. No.: 17/748,357

(22) Filed: May 19, 2022

(65) Prior Publication Data

US 2023/0064611 A1    Mar. 2, 2023

(30) Foreign Application Priority Data

Aug. 27, 2021  (KR) .................. 10-2021-0114140

(51) Int. Cl.
| | | |
|---|---|---|
| G11C 11/40 | (2006.01) | |
| G11C 11/4091 | (2006.01) | |
| G11C 11/4094 | (2006.01) | |
| G11C 11/4097 | (2006.01) | |

(52) U.S. Cl.
CPC ...... G11C 11/4091 (2013.01); G11C 11/4094 (2013.01); G11C 11/4097 (2013.01)

(58) Field of Classification Search
CPC ............ G11C 11/4091; G11C 11/4094; G11C 11/4097

See application file for complete search history.

(56) References Cited

U.S. PATENT DOCUMENTS

| | | |
|---|---|---|
| 8,009,496 B2 | 8/2011 | Kim |
| 8,310,859 B2 | 11/2012 | Seo et al. |
| 10,074,408 B2 * | 9/2018 | Seo ............... G11C 11/4091 |
| 10,242,720 B2 | 3/2019 | Chen et al. |
| 11,024,365 B1 * | 6/2021 | Seo ............... G11C 11/4091 |
| 2002/0003734 A1 | 1/2002 | Kim et al. |
| 2005/0219925 A1 | 10/2005 | Rho |
| 2010/0002528 A1 | 1/2010 | Okawa |

FOREIGN PATENT DOCUMENTS

| | | |
|---|---|---|
| KR | 10-2005-0039266 A | 4/2005 |
| KR | 10-2009-0036827 A | 4/2009 |

* cited by examiner

*Primary Examiner* — Vanthu T Nguyen
(74) *Attorney, Agent, or Firm* — Muir Patent Law, PLLC

(57) ABSTRACT

A bit line sense amplifier includes a plurality of semiconductor devices including sensing transistors and selection transistors disposed side by side, and configured to sense a voltage change of a bit line and a complementary bit line, and wiring patterns connected to at least one of the plurality of semiconductor devices. The sensing transistors share a source electrode. The selection transistors may be controlled to be complementarily turned on and off. The wiring patterns include a first wiring pattern electrically connecting gate electrodes of the sensing transistors and drain electrodes of the selection transistors, and a second wiring pattern electrically connecting a gate electrode of a sensing transistor and a drain electrode of another sensing transistor.

7 Claims, 11 Drawing Sheets

BIT LINE SENSE AMPLIFIER AND SEMICONDUCTOR MEMORY DEVICE HAVING THE SAME

CROSS-REFERENCE TO RELATED APPLICATION

This application claims the benefit under 35 U.S.C. 119(a) of Korean Patent Application No. 10-2021-0114140 filed on Aug. 27, 2021, in the Korean Intellectual Property Office, the entire disclosure of which is incorporated herein by reference for all purposes.

BACKGROUND

1. Field

Embodiments relate to a bit line sense amplifier and a semiconductor memory device including the same.

2. Description of the Related Art

Semiconductor memory devices may be divided into volatile memory devices and nonvolatile memory devices. In a volatile memory device, stored data may be lost when a power supply is cut off, and examples thereof include a static random access memory (SRAM), a dynamic random access memory (DRAM), etc.

SUMMARY

According to an embodiment, a bit line sense amplifier includes a plurality of first semiconductor devices including a plurality of sensing transistors and a plurality of selection transistors disposed side by side in a first direction, and sensing a voltage change of a bit line and a complementary bit line, and a plurality of wiring patterns disposed on the plurality of first semiconductor devices to extend in the first direction and electrically connected to at least one of the plurality of first semiconductor devices. The plurality of sensing transistors include a first transistor, a second transistor and a third transistor sharing a source electrode, the plurality of selection transistors include a first selection transistor and a second selection transistor controlled to be complementarily turned on and off, and the plurality of wiring patterns include a first wiring pattern electrically connecting a gate electrode of the first transistor, a gate electrode of the third transistor, a drain electrode of the first selection transistor, and a drain electrode of the second selection transistor, and a second wiring pattern electrically connecting a gate electrode of the second transistor and a drain electrode of the third transistor.

According to an embodiment, a bit line sense amplifier includes a sensing amplification unit sensing a voltage difference between the bit line and the complementary bit line and adjusting voltages of the sensing bit line and the complementary sensing bit line based on the sensed voltage difference, an isolation unit including a first isolation transistor connected to the bit line and the sensing bit line and controlled by an isolation signal, and a second isolation transistor connected between the complementary bit line and the complementary sensing bit line and controlled by the isolation signal, an offset cancellation unit including an offset cancellation transistor connected between the complementary bit line and the sensing bit line and controlled by an offset cancellation signal, and a transistor selection unit including a first selection transistor and a second selection transistor connected to the complementary sensing bit line and controlled to be complementarily turned on and off by a sense amplifier select signal. The sensing amplification unit includes a first transistor connected to the first selection transistor and controlled by a voltage change of the complementary sensing bit line, and a second transistor connected to the second selection transistor and controlled by a voltage change of the sensing bit line.

According to an embodiment, a semiconductor memory device includes a plurality of memory blocks each including at least one memory cell, a plurality of first sense amplifier blocks each including a bit line sense amplifier including a plurality of transistors connected to a first bit line and a first complementary bit line, between the plurality of memory blocks, and a plurality of second sense amplifier blocks electrically connected to outermost memory blocks among the plurality of memory blocks, and each including a bit line sense amplifier including a plurality of transistors connected to a second bit line and a second complementary bit line. The bit line sense amplifier included in each of the plurality of first sense amplifier blocks and the plurality of second sense amplifier blocks senses a voltage change of a bit line corresponding to a respective bit line sense amplifier, and adjusts a voltage of a sensing bit line and a complementary sensing bit line, based on the sensed voltage change. The plurality of transistors included in the plurality of second sense amplifier blocks include a first selection transistor and a second selection transistor connected to the complementary sensing bit line in parallel, a first transistor connected to the first selection transistor and controlled by a voltage change of the complementary sensing bit line, and a second transistor connected to the second selection transistor and controlled by a voltage change of the sensing bit line.

BRIEF DESCRIPTION OF DRAWINGS

Features will become apparent to those of skill in the art by describing in detail example embodiments with reference to the attached drawings in which.

DETAILED DESCRIPTION

Figure 1:
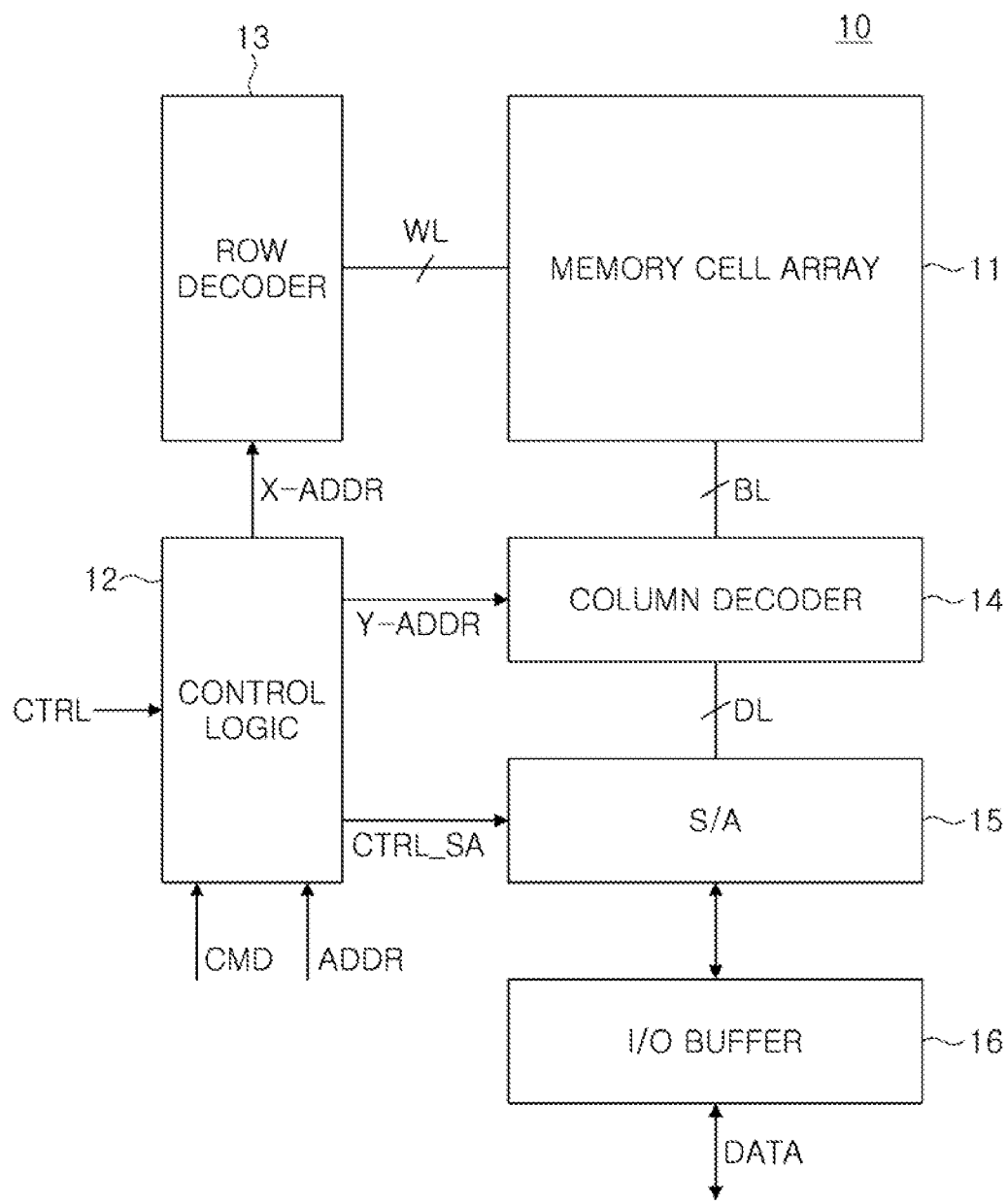
FIG. 1 is a schematic block diagram of a semiconductor memory device according to an example embodiment.

FIG. 1 is a schematic block diagram of a semiconductor memory device according to an example embodiment.

Referring to FIG. 1, a semiconductor memory device 10 according to an example embodiment may be a storage device based on a semiconductor device. For example, the semiconductor memory device 10 may be a volatile memory, such as a dynamic random access memory (DRAM), a synchronous DRAM (SDRAM), a double data rate SDRAM (DDR SDRAM), a low power double data rate SDRAM (LPDDR SDRAM), a graphics double data rate SDRAM (GDDR SDRAM), DDR2 SDRAM, DDR3 SDRAM, DDR4 SDRAM, Thyristor RAM (TRAM), etc.

The semiconductor memory device 10 may output data DATA in response to a command CMD, an address ADDR, and control signals CTRL received from an external device, e.g., a memory controller. The semiconductor memory device 10 may include a memory cell array 11, a control logic 12, a row decoder 13, a column decoder 14, a bit line sense amplifying unit 15, and an input/output buffer 16. The semiconductor memory device 10 may further include additional components used for operations.

The memory cell array 11 may include a plurality of memory cells arranged in matrix form along a plurality of rows and columns. The memory cell array 11 may include a plurality of word lines WL and a plurality of bit lines BL connected to the plurality of memory cells.

The plurality of memory cells included in the memory cell array 11 may be connected to the row decoder 13 through a plurality of word lines WL, and may be connected to the column decoder 14 through the plurality of bit lines BL. In the semiconductor memory device 10 according to an example embodiment, the memory cell array 11 may include a plurality of memory blocks including the plurality of memory cells.

The control logic 12 may output various control signals for performing an operation of writing data to the memory cell array 11 or reading data from the memory cell array 11, based on the command CMD, the address ADDR, and the control signal CTRL received from the external device, e.g., the memory controller.

The command CMD may include an active command, a read command, a write command, a precharge command, etc. The address ADDR may include a row address X-ADDR and a column address Y-ADDR. The control signal CTRL may include a write enable signal, a row address strobe signal, a column address strobe signal, a chip select signal, etc. The control logic 12 may control various overall operations in the semiconductor memory device 10.

Various control signals output from the control logic 12 may be provided to the row decoder 13, the column decoder 14, and the bit line sense amplifying unit 15. As an example, the control logic 12 may provide a row address X-ADDR to the row decoder 13, and may provide a column address Y-ADDR to the column decoder 14. Also, the control logic 12 may provide a sensing control signal CTRL_SA to the bit line sense amplifying unit 15. The control logic 12 may further provide other control signals to the input/output buffer 16 and other components not illustrated.

The row decoder 13 may receive the row address X-ADDR to select any one of the plurality of word lines WL connected to the memory cell array 11. The row decoder 13 may select any one word line corresponding to the received row address X-ADDR, and apply a word line voltage to each of the plurality of word lines WL in response to the control signal to activate the selected word line.

The column decoder 14 may receive the column address Y-ADDR of the memory cell array 11 to select a predetermined bit line from among the plurality of bit lines BL connected to the memory cell array 11. The column decoder 14 may select any one bit line corresponding to the received column address Y-ADDR, and may activate the selected bit line in response to the control signal.

The bit line sense amplifying unit 15 may be connected to the plurality of bit lines BL connected to the memory cell array 11. The bit line sense amplifying unit 15 may sense a voltage change of a selected bit line among the plurality of bit lines BL, and amplify and output the sensed voltage change.

The input/output buffer 16 may output data DATA output based on the voltage amplified by the bit line sense amplifying unit 15 externally.

In the semiconductor memory device according to an example embodiment, the bit line sense amplifying unit 15 may include a plurality of sense amplifier blocks including the bit line sense amplifier. The bit line sense amplifier included in each of the plurality of sense amplifier blocks may receive an isolation signal, an offset cancellation signal, a transistor select signal, and the like from the control logic 12 or an external device. The bit line sense amplifier may perform an offset cancellation operation and a pre-sensing operation according to the isolation signal and the offset cancellation signal, and may selectively turn on the sensing transistor according to the transistor select signal.

In the semiconductor memory device according to an example embodiment, the offset may indicate a difference in characteristics, e.g., in threshold voltages, between semiconductor devices constituting the bit line sense amplifier.

The bit line sense amplifier may operate as a differential amplifier or a latch circuit according to a turned-on sensing transistor.

Figure 2:
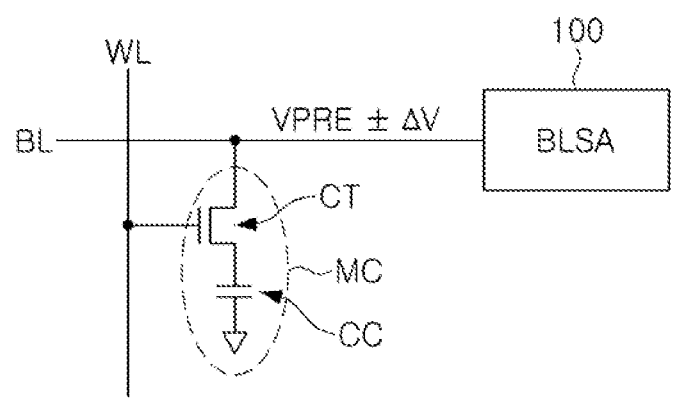
FIG. 2 is a diagram illustrating a bit line voltage sensing operation of a bit line sense amplifier according to an example embodiment.

FIG. 2 is a diagram illustrating a bit line voltage sensing operation of a bit line sense amplifier according to an example embodiment.

Referring to FIGS. 1 and 2, a memory cell MC included in the memory cell array 11 of the semiconductor memory device 10 may include a cell transistor CT and a cell capacitor CC. The cell transistor CT may be connected between the bit line BL and the cell capacitor CC. A gate electrode of the cell transistor CT may be connected to the word line WL. The semiconductor memory device 10 according to an example embodiment may perform a read operation or a refresh operation based on the amount of charge of the cell capacitor CC included in the memory cell MC.

The bit line BL connected to the memory cell MC may be precharged with a precharge voltage VPRE. Thereafter, as the word line WL is activated, charge sharing may be generated between the charge of the bit line BL (which is charged with the pre-charge voltage VPRE) and the charge of the cell capacitor CC. Due to the charge sharing, the voltage of the bit line BL may increase or decrease from the pre-charge voltage VPRE by a voltage change amount $\Delta V$. The bit line sense amplifier 100 according to an example embodiment may sense the voltage change amount $\Delta V$ of the bit line BL voltage, and amplify the sensed voltage change amount.

In general, if the voltage change amount $\Delta V$ is a predetermined level or below, then the bit line sense amplifier 100 may not detect the voltage change amount $\Delta V$. Also, the voltage change amount $\Delta V$ may be small compared to the pre-charge voltage VPRE, such that the operation of the bit line sense amplifier 100 may be affected by noise.

According to an example embodiment, the bit line sense amplifier 100 may reduce bit line coupling noise and bit line sense amplifier offset noise by performing an offset cancellation operation and a pre-sensing operation using the isolation signal and the offset cancellation signal. The isolation signal and the offset cancellation signal may control a plurality of transistors included in the bit line sense amplifier.

For example, when isolation transistors (operating according to the control of the isolation signal) are turned off and offset cancellation transistors (operating according to the offset cancellation signal) are turned on, the bit line sense amplifier may perform the offset cancellation operation. On the other hand, when both the isolation transistors and the offset cancellation transistors are turned off, the bit line sense amplifier may perform a pre-sensing operation.

Figure 3:
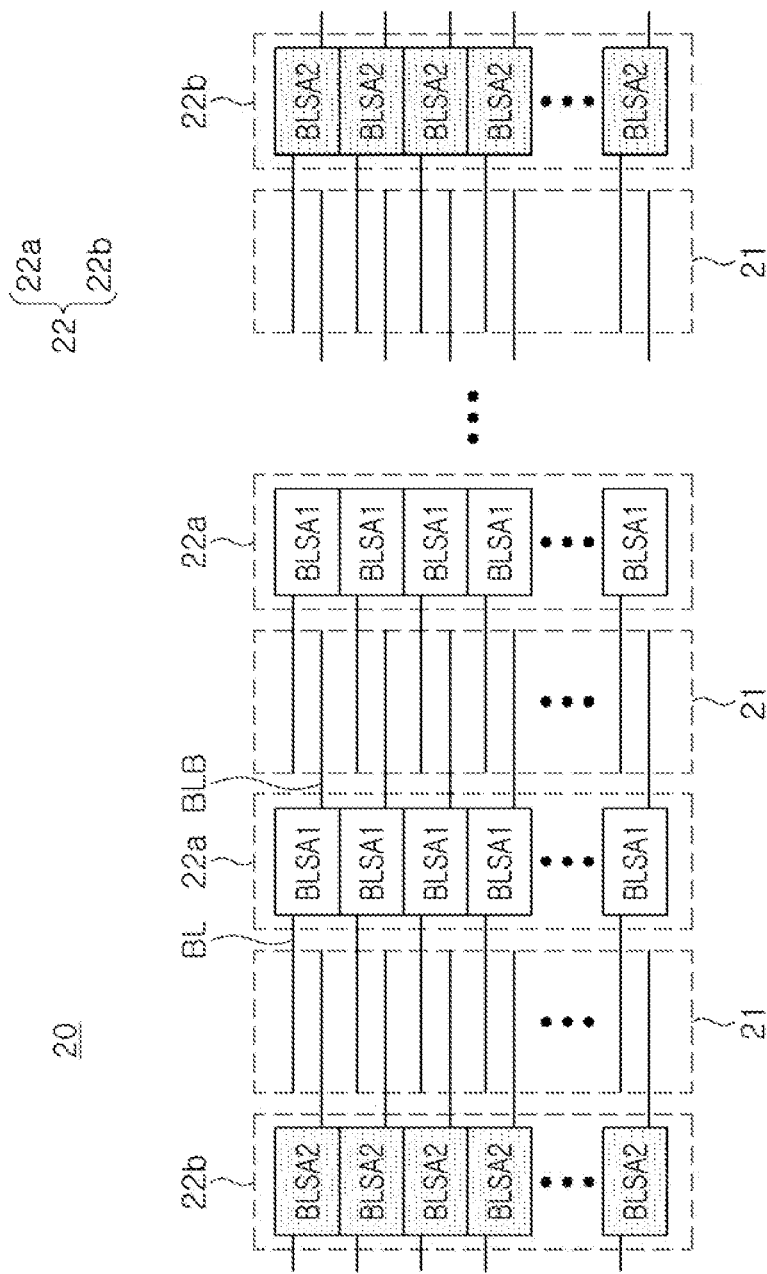
FIG. 3 is a diagram illustrating a bit line sense amplifier included in a semiconductor memory device according to an example embodiment.

FIG. 3 is a diagram illustrating a bit line sense amplifier included in a semiconductor memory device according to an example embodiment.

Referring to FIG. 3, a semiconductor memory device 20 according to an example embodiment may include a plurality of memory blocks 21 and a plurality of sense amplifier blocks 22. The plurality of memory blocks 21 and the plurality of sense amplifier blocks 22 may be alternately disposed with each other.

Each of the plurality of memory blocks 21 may include at least one memory cell.

Each of the plurality of sense amplifier blocks 22 may include a bit line sense amplifier, which detects a voltage change of a bit line corresponding to each bit line sense amplifier and amplifies and outputs the sensed voltage change.

The plurality of sense amplifier blocks 22 may include a plurality of first sense amplifier blocks 22a disposed between the plurality of memory blocks 21, and a plurality of second sense amplifier blocks 22b, which may be disposed at the edge of the plurality of memory blocks 21.

In the semiconductor memory device 20 according to an example embodiment, the plurality of first sense amplifier blocks 22a and the plurality of second sense amplifier blocks 22b may have different structures.

In the semiconductor memory device 20 according to an example embodiment, two input terminals of the bit line sense amplifier may be connected to a bit line BL and a complementary bit line BLB, respectively. For example, the bit line BL may provide data obtained by a read operation, and the complementary bit line BLB may be used to generate a reference voltage. In the semiconductor memory device 20 having the structure illustrated in FIG. 3, a capacitance imbalance may exist between the bit line BL and the complementary bit line BLB and, if the capacitances of the bit line BL and the complementary bit line BLB are different from each other, the sensing sensitivity of the bit line sense amplifier may decrease due to a loading mismatch. Accordingly, the sensing operation may not be performed normally. The capacitance imbalance between the bit line BL and the complementary bit line BLB may be included in the offset noise of the bit line sense amplifier, and the capacitance imbalance may be compensated for to some extent by the offset cancellation operation of the bit line sense amplifier. However, in the case of the second sense amplifier blocks 22b connected to outermost memory blocks among the plurality of memory blocks 21, it may be difficult to address the capacitance imbalance using only by the offset cancellation operation.

With respect to the above, in general, in order to prevent capacitance imbalance between a bit line BL and a complementary bit line BLB, a method of disposing dummy memory blocks and/or capacitor blocks at edges of a plurality of memory blocks included in a semiconductor memory device may be considered. For example, each of the dummy memory blocks and/or the capacitor blocks may be connected to an adjacent bit line sense amplifier to compensate for capacitance imbalance. However, in this case, the dummy memory blocks and/or capacitor blocks that are added to prevent the capacitance imbalance may increase the size of the semiconductor memory device. Thus, the dummy memory blocks and/or the capacitor blocks may reduce the degree of integration of the semiconductor memory device.

The semiconductor memory device 20 according to an example embodiment may include a plurality of second sense amplifiers including a bit line sense amplifier having a structure different from that of the bit line sense amplifier included in the plurality of first sense amplifier blocks 22a. For example, the number of transistors for implementing the bit line sense amplifier included in the plurality of second sense amplifier blocks 22b may be more than the number of transistors for implementing the bit line sense amplifier included in the plurality of first sense amplifier blocks 22a.

In addition to the configuration of the bit line sense amplifier included in the plurality of first sense amplifier blocks 22a, the bit line sense amplifier included in the plurality of second sense amplifier blocks 22b may further include a selection transistor that is complementarily turned on and off, and a sensing transistor connected to the selection transistor. The bit line sense amplifier included in the plurality of second sense amplifier blocks 22b may selectively operate as a differential amplifier and a latch circuit according to an operation period, thereby performing a normal sensing operation without dummy memory blocks and/or capacitor blocks.

Accordingly, in the semiconductor memory device 20 according to an example embodiment, outermost memory blocks among the plurality of memory blocks 21 may include memory cells storing data, i.e., the outermost memory blocks among the plurality of memory blocks 21 may not be dummy memory blocks. The second sense amplifier block 22b may be disposed at the edges of the outermost memory blocks. Accordingly, the semiconductor memory device 20 according to an example embodiment may mitigate or avoid a size increase that may occur as a result of addressing the capacitance imbalance.

With respect to the above, in general, if transistors are added to a bit line sense amplifier included in a plurality of inner sense amplifier blocks (e.g., corresponding to the first sense amplifier blocks 22a), then a number of wiring patterns used to connect the transistors may increase. Accordingly, a width of a region in which a bit line sense amplifier included in a plurality of outer sense amplifier blocks (e.g., corresponding to the second sense amplifier blocks 22b) is formed may increase, or a width of a wiring pattern may decrease in a direction perpendicular to a direction in which the wiring patterns extend on a layout. Such changes in process may increase the process complexity of a semiconductor memory device.

In the case of the semiconductor memory device 20 according to an example embodiment, the bit line sense amplifier included in the plurality of second sense amplifier blocks 22b may be designed such that a selection transistor (used to select one of a differential amplifier and a latch circuit) and a sensing transistor (implementing the differential amplifier and the sensing transistor) are connected by one wiring pattern. Accordingly, on a layout, the bit line sense amplifier included in the plurality of second sense amplifier blocks 22b may be implemented without increasing a width of a region in a direction in which the bit line sense amplifier included in the plurality of second sense amplifier blocks 22b is formed.

In detail, the width of the region in one direction, in which the bit line sense amplifier included in the plurality of second sense amplifier blocks 22b is formed on the layout, may be the same as the width of the region in one direction, in which the bit line sense amplifiers included in the plurality of first sense amplifier blocks 22a are formed.

However, according to another example embodiment, the width of the region in one direction in which the bit line sense amplifier included in the plurality of second sense amplifier blocks 22b is formed on the layout may be different from the width of the region in one direction in which the bit line sense amplifiers included in the plurality of first sense amplifier blocks 22a are formed.

Figure 4:
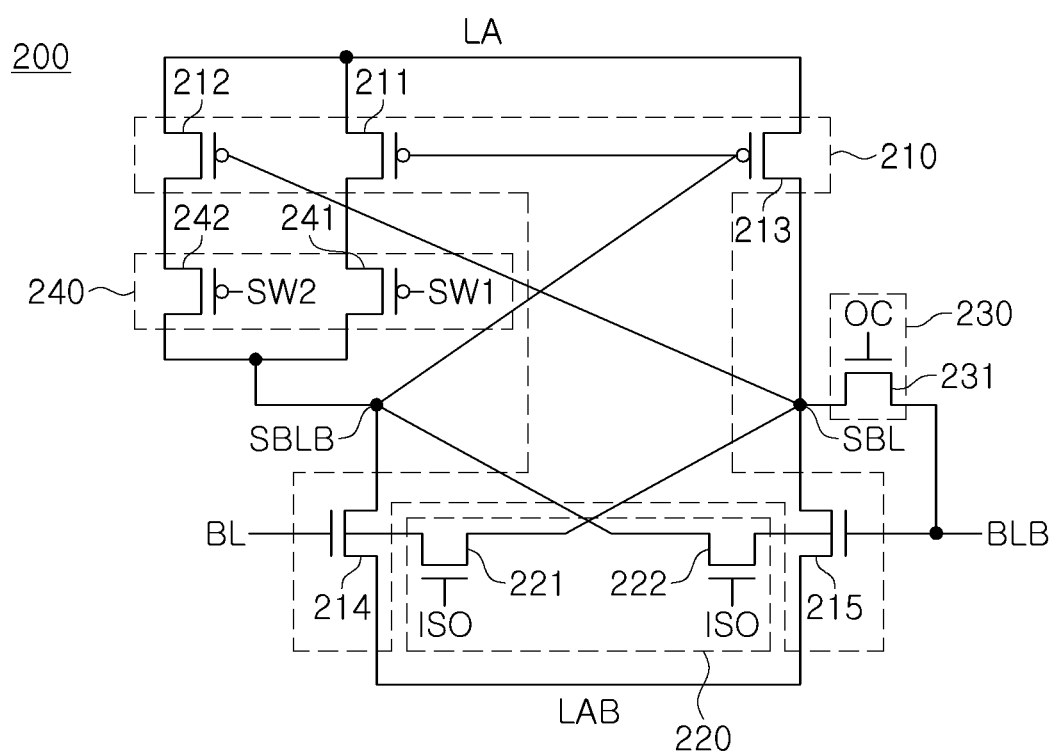
FIG. 4 is a circuit diagram of a bit line sense amplifier according to an example embodiment.

FIG. 4 is a circuit diagram of a bit line sense amplifier according to an example embodiment.

Referring to FIG. 4, a circuit diagram of a bit line sense amplifier 200 may correspond to a circuit diagram of the bit line sense amplifier included in each of the plurality of second sense amplifier blocks 22b in the semiconductor memory device 20 described in connection with FIG. 3.

Referring to FIG. 4, the bit line sense amplifier 200 according to an example embodiment may include a sensing amplification unit 210, an isolation unit 220, an offset cancellation unit 230, and a transistor selection unit 240.

The isolation unit 220 may include a first isolation transistor 221 connected between a bit line BL and a sensing bit line SBL, and a second isolation transistor 222 connected between a complementary bit line BLB and a complementary sensing bit line SBLB. The first isolation transistor 221 and the second isolation transistor 222 may be controlled by an isolation signal ISO. For example, two electrodes of the first isolation transistor 221 may be connected to the bit line BL and the sensing bit line SBL, respectively, and the isolation signal ISO may be applied to a gate electrode of the first isolation transistor 221. Similarly, two electrodes of the second isolation transistor 222 may be connected to the complementary bit line BLB and the complementary sensing bit line SBLB, respectively, and the isolation signal ISO may be applied to a gate electrode of the second isolation transistor 222.

The offset cancellation unit 230 may include an offset cancellation transistor 231 connected between the complementary bit line BLB and the sensing bit line SBL and controlled by an offset cancellation signal OC. Two electrodes of the offset cancellation transistor 231 may be connected to the complementary bit line BLB and the sensing bit line SBL, respectively. The offset cancellation signal OC may be applied to a gate electrode of the offset cancellation transistor 231.

In FIG. 4, the first isolation transistor 221, the second isolation transistor 222, and the offset cancellation transistor 231 are all illustrated as NMOS transistors, but, e.g., the first isolation transistor 221, the second isolation transistor 222, and the offset cancellation transistor 231 may be a switch device implemented as a PMOS transistor or the like.

The sensing amplification unit 210 may be connected between the sensing bit line SBL and the complementary sensing bit line SBLB, and may include a plurality of sensing transistors 211, 212, 213, 214 and 215 sensing and amplifying a voltage difference between the bit line BL and the complementary bit line BLB according to a first control signal LA and a second control signal LAB.

In the bit line sense amplifier 200 according to an example embodiment, the plurality of sensing transistors 211, 212, 213, 214 and 215 included in the sensing amplification unit 210 may include a first transistor 211, a second transistor 212, a third transistor 213, a fourth transistor 214, and a fifth transistor 215. The first transistor 211, the second transistor 212, and the third transistor 213 may be PMOS transistors, and the fourth transistor 214 and the fifth transistor 215 may be NMOS transistors.

The transistor selection unit 240 may include a first selection transistor 241 and a second selection transistor 242 connected to the complementary sensing bit line in parallel and controlled by sense amplifier select signals SW1 and SW2. The first selection transistor 241 and the second selection transistor 242 may be PMOS transistors. The first selection transistor 241 and the second selection transistor 242 may be controlled to be complementarily turned on and off. For example, the second selection transistor 242 may be turned off while the first selection transistor 241 is turned on, and the second selection transistor 242 may be turned on while the first selection transistor 241 is turned off.

The first transistor 211 and the second transistor 212 of the plurality of sensing transistors 211, 212, 213, 214, and 215 may be connected to the first selection transistor 241 and the second selection transistor 242 in series, respectively. Accordingly, the first selection transistor 241 and the second selection transistor 242 that are complementarily turned on/off may select a transistor performing an operation in the bit line sense amplifier 200.

The first transistor 211 may be controlled by a voltage change of the complementary sensing bit line SBLB connected to the gate electrode of the first transistor 211.

The second transistor 212 may be controlled by a voltage change of the sensing bit line SBL connected to the gate electrode of the second transistor 212.

The first transistor 211 and the second transistor 212 may share a first node to which the first control signal LA is applied.

The third transistor 213 may be connected between the sensing bit line SBL and the first node to which the first control signal LA is applied. A gate electrode of the third transistor 213 may be connected to the complementary sensing bit line SBLB. The third transistor 213 may be controlled by a voltage change of the complementary sensing bit line SBLB.

The fourth transistor 214 may be connected between the complementary sensing bit line SBLB and a second node to which the second control signal LAB is applied. A gate electrode of the fourth transistor 214 may be connected to the bit line BL. The fourth transistor 214 may be controlled by a voltage change of the bit line BL.

The fifth transistor 215 may be connected between the sensing bit line SBL and the second node to which the second control signal LAB is applied. A gate electrode of the fifth transistor 215 may be connected to the complementary bit line BLB. The fifth transistor 215 may be controlled by a voltage change of the complementary bit line BLB.

Figure 5:
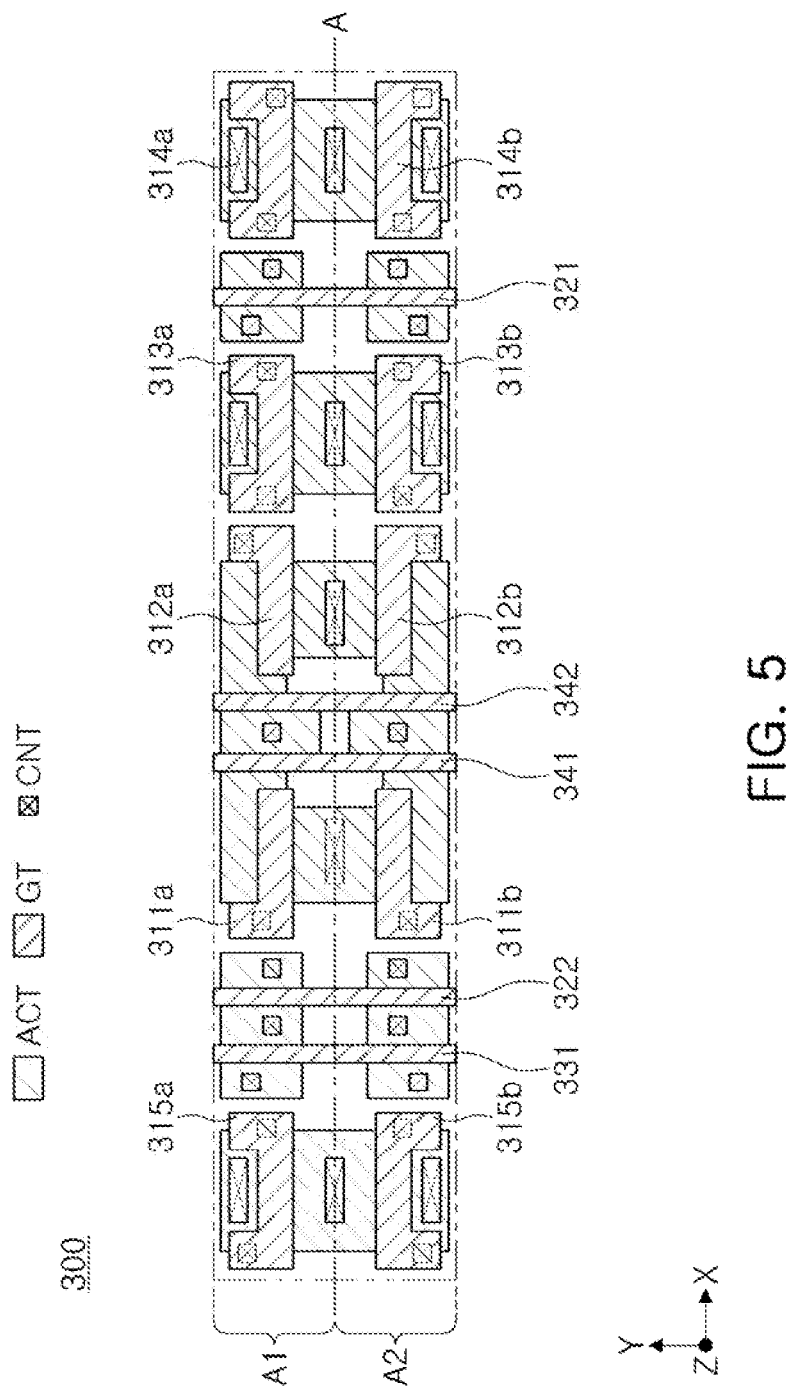
FIGS. 5 to 7 are diagrams illustrating the layout of a bit line sense amplifier according to an example embodiment.
Figure 6:
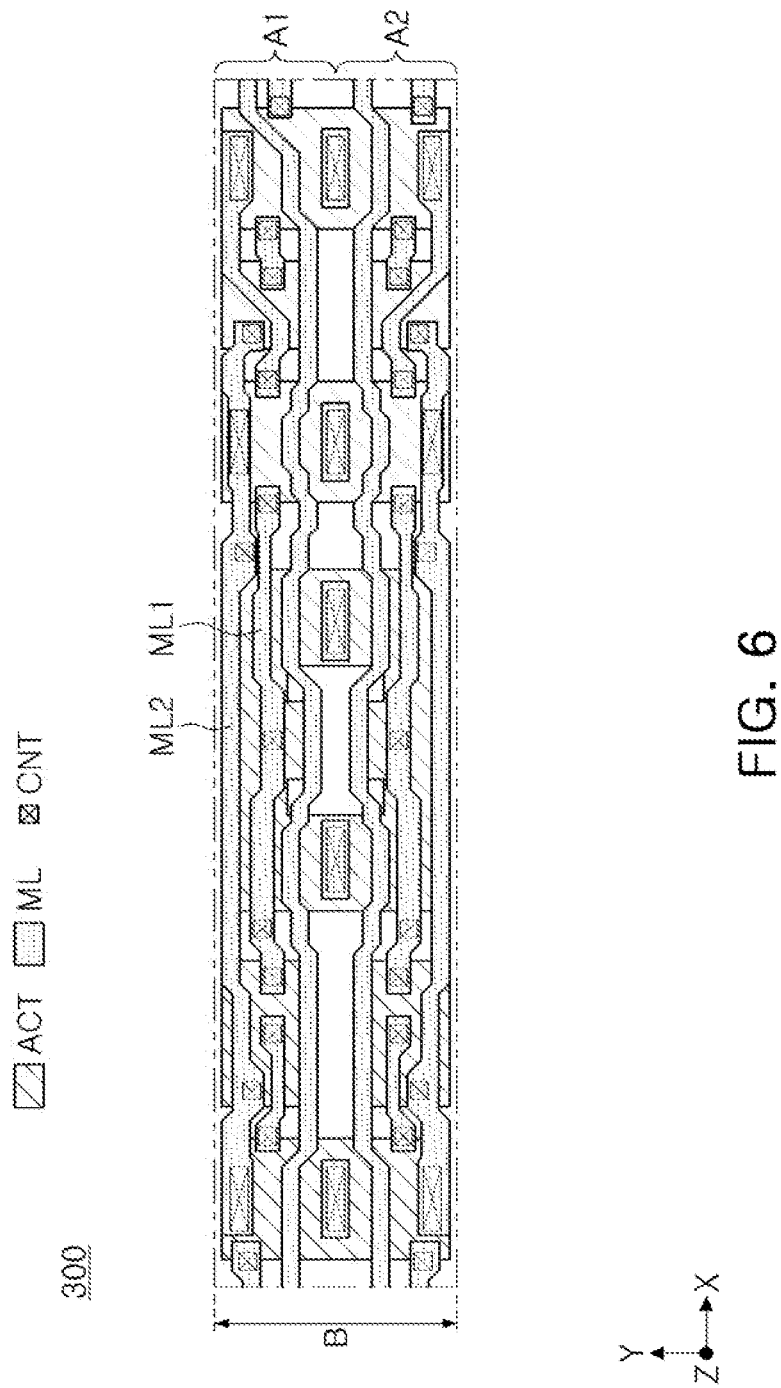
Figure 7:
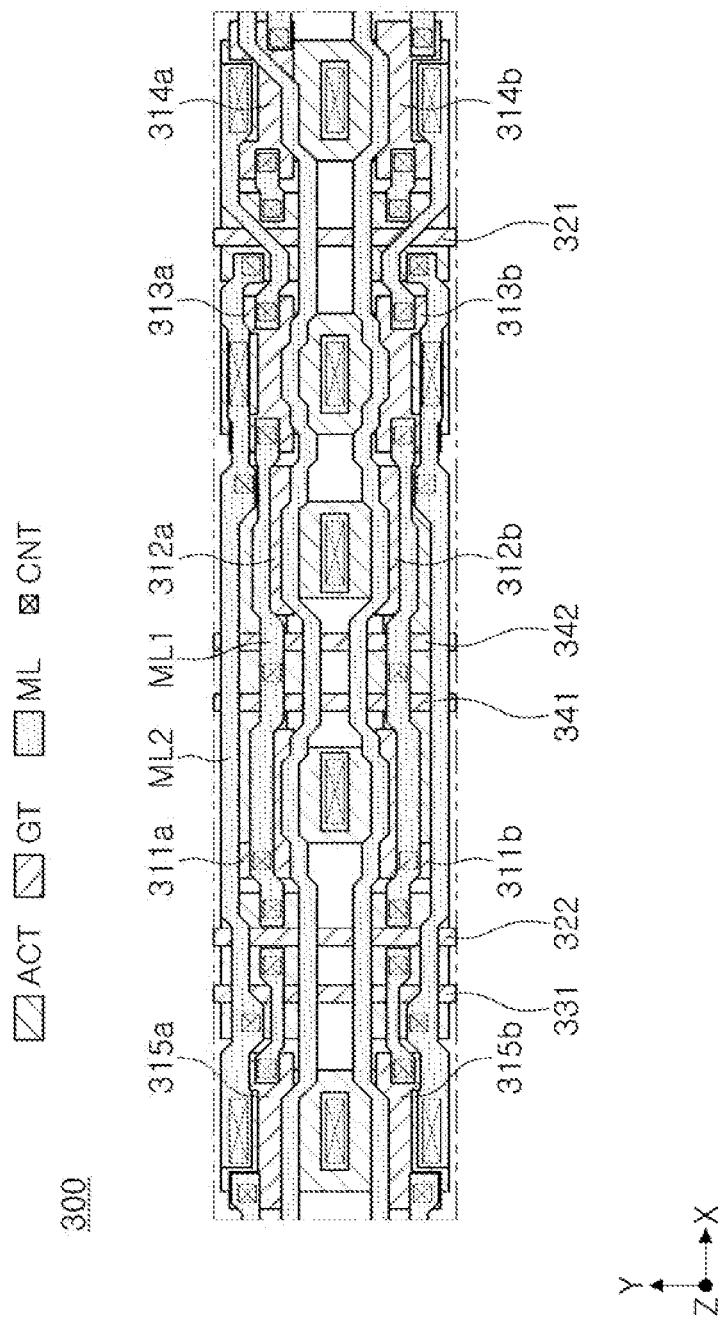

FIGS. 5 to 7 are diagrams illustrating the layout of a bit line sense amplifier according to an example embodiment.

FIGS. 5 to 7 illustrate layouts of a bit line sense amplifier 300 according to an example embodiment. FIG. 5 illustrates an active region ACT, a gate region GT, and a plurality of contacts CNT, FIG. 6 illustrates a plurality of wiring patterns ML (instead of the gate region GT). FIG. 7 illustrates both the gate region GT and the plurality of wiring patterns ML, to illustrate a connection relationship between the plurality of semiconductor devices.

Referring to FIGS. 5 to 7, a bit line sense amplifier 300 according to an example embodiment may be implemented by a plurality of semiconductor devices disposed in a first direction (e.g., an X direction) and a second direction (e.g., a Y direction) perpendicular to the first direction.

Referring to FIG. 5, the plurality of semiconductor devices may include a plurality of first semiconductor devices, and may include second semiconductor devices disposed symmetrically to the plurality of first semiconductor devices with respect to a reference line A. A region in which the plurality of first semiconductor devices are disposed may be defined as a first area A1. A region in which the plurality of second semiconductor devices are disposed may be defined as a second area A2. The second area A2 may be disposed on one side of the first area A1 in the second direction.

Hereinafter, characteristics thereof will be described based on the characteristics of the plurality of first semiconductor devices disposed in the first area A1 for convenience.

The plurality of first semiconductor devices disposed in the first area A1 may include a plurality of sensing transistors 311a, 312a, 313a, 314a, and 315a, and a plurality of selection transistors 341 and 342. The plurality of first semiconductor devices may further include a first isolation transistor 321, a second isolation transistor 322, and an offset cancellation transistor 331. The plurality of first semiconductor devices may be disposed side by side in the first direction, and may sense and amplify a voltage difference between the bit line and the complementary bit line.

The plurality of first semiconductor devices may correspond to respective devices of the bit line sense amplifier 200 illustrated in FIG. 4. For example, the plurality of sensing transistors 311a, 312a, 313a, 314a, and 315a may correspond to the first to fifth transistors 211, 212, 213, 214 and 215, respectively, and the plurality of selection transistors 341 and 342 may correspond to the first selection transistor 241 and the second selection transistor 242, respectively. Similarly, the first isolation transistor 321, the second isolation transistor 322, and the offset cancellation transistor 331 may correspond to the transistors 221, 222, and 231 illustrated in the bit line sense amplifier 200 of FIG. 4.

In the bit line sense amplifier 300 according to the example embodiment, among the plurality of sensing transistors, the first transistor 311a, the second transistor 312a, and the third transistor 313a may share a source electrode.

The first selection transistor 341 and the second selection transistor 342 may be controlled to be complementarily turned on and off.

Referring to FIG. 5, the plurality of semiconductor devices disposed in the first area A1 and the second area A2 may be implemented by the active region ACT and the gate region GT formed to intersect each other. The symbols illustrated in FIG. 5 are indicated on the gate region GT of each of the plurality of semiconductor devices, but may not refer to the gate region GT itself and may refer to transistors implemented by the gate region GT and the active region ACT therearound.

The first to third transistors 311, 312, and 313 may be PMOS transistors. The fourth and fifth transistors 314 and 315 may be NMOS transistors. Accordingly, the active region ACT implementing the first to third transistors 311, 312, and 313 may be doped with a P-type impurity, and the active region ACT implementing the fourth and fifth transistors 314 and 315 may be doped with an N-type impurity.

In the bit line sense amplifier 300 according to an example embodiment, each of the gate electrodes of the plurality of sensing transistors 311a, 312a, 313a, 314a, and 315a may extend in the first direction. On the other hand, each of the gate electrodes of the plurality of selection transistors 341 and 342, the first isolation transistor 321, the second isolation transistor 322, and the offset cancellation transistor 331 may extend in the second direction. The direction in which the plurality of sensing transistors 311a, 312a, 313a, 314a, and 315a are formed may be orthogonal to the direction in which the plurality of selection transistors 341 and 342 are formed.

The gate electrodes of the plurality of selection transistors 341 and 342 may be formed over the first area A1 and the second area A2. However, the gate electrodes of the plurality of sensing transistors 311a, 312a, 313a, 314a, and 315a formed in the first area A1 and the gate electrodes of the plurality of sensing transistors 311b, 312b, 313b, 314b, and 315b formed in the second area A2 may respectively be formed separately.

Active electrodes of the plurality of sensing transistors 311a, 312a, 313a, 314a, 315a, 311b, 312b, 313b, 314b, and 315b may be formed adjacent to each other at the boundary of the first area A1 and the second area A2. Active electrodes of the plurality of selection transistors 341 and 342 may be formed to be separated from each other in the first area A1 and the second area A2.

Referring to FIG. 6, the plurality of wiring patterns ML may be formed to extend in the first direction (e.g., the X direction) on the plurality of semiconductor devices. However, the shape of the plurality of wiring patterns ML illustrated in FIG. 6 may vary relative to the illustrated example, and the plurality of wiring patterns ML may not be completely parallel to each other.

In the bit line sense amplifier 300 according to an example embodiment, the plurality of wiring patterns ML may include a first wiring pattern ML1, a second wiring pattern ML2, and other wiring patterns. The plurality of wiring patterns ML may be electrically connected to at least one of the plurality of semiconductor devices.

In the first area A1 and the second area A2, the number of the plurality of wiring patterns arranged in the second direction (e.g., the Y direction) may be 7 or less.

Accordingly, the bit line sense amplifier 300 according to an example embodiment including a larger number of transistors than a general bit line sense amplifier may be implemented without increasing a width B in the second direction on the layout.

Referring to FIG. 7, in the bit line sense amplifier 300 according to an example embodiment, the first wiring pattern ML1 may electrically connect the gate electrode of the first transistor 311a, the gate electrode of the third transistor 313a, a drain electrode of the first selection transistor 341, and a drain electrode of the second selection transistor 342. The second wiring pattern ML2 may electrically connect the gate electrode of the second transistor 312a and the drain electrode of the third transistor 313a.

For disposition of the first wiring pattern ML1 and the second wiring pattern ML2, the first transistor 311a and the first selection transistor 341 may be disposed closest to each other in the first direction (e.g., the X direction). On the other hand, the second transistor 312a and the second selection transistor 342 may be disposed close to each other in the first direction.

The fourth transistor 314a included in the bit line sense amplifier 300 has an electrode electrically connected to the first wiring pattern ML1, and may be controlled by a voltage change of the bit line. The fifth transistor 315a has an electrode electrically connected to the second wiring pattern ML2, and may be controlled by a voltage change of a complementary bit line.

The first isolation transistor 321 included in the bit line sense amplifier 300 may be connected between the bit line and the second wiring pattern ML2. The second isolation transistor 322 may be connected between the complementary bit line and the first wiring pattern ML1. The offset cancellation transistor 331 may be connected between the complementary bit line and the second wiring pattern ML2.

The first wiring pattern ML1 may correspond to the complementary sensing bit line.

The second wiring pattern ML2 may correspond to the sensing bit line. However, the layout of the bit line sense amplifier 300 illustrated in FIGS. 5 to 7 is merely an example, and the bit line sense amplifier 300 may be designed in various forms depending on example embodiments.

Figure 8:
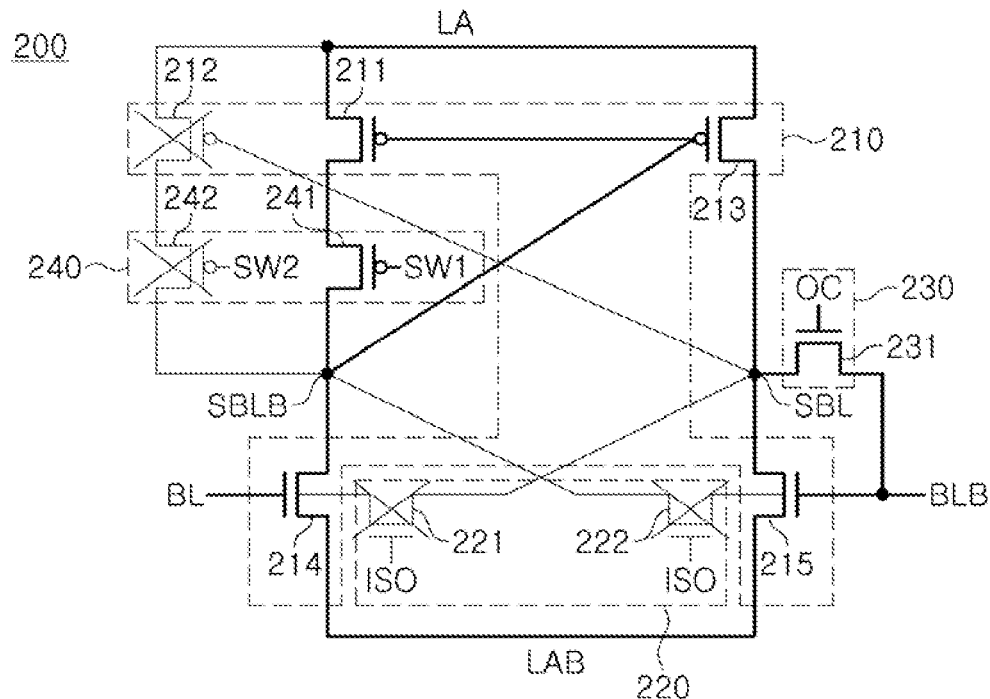
FIGS. 8 to 10 are diagrams illustrating an operation of a bit line sense amplifier according to an example embodiment.
Figure 9:
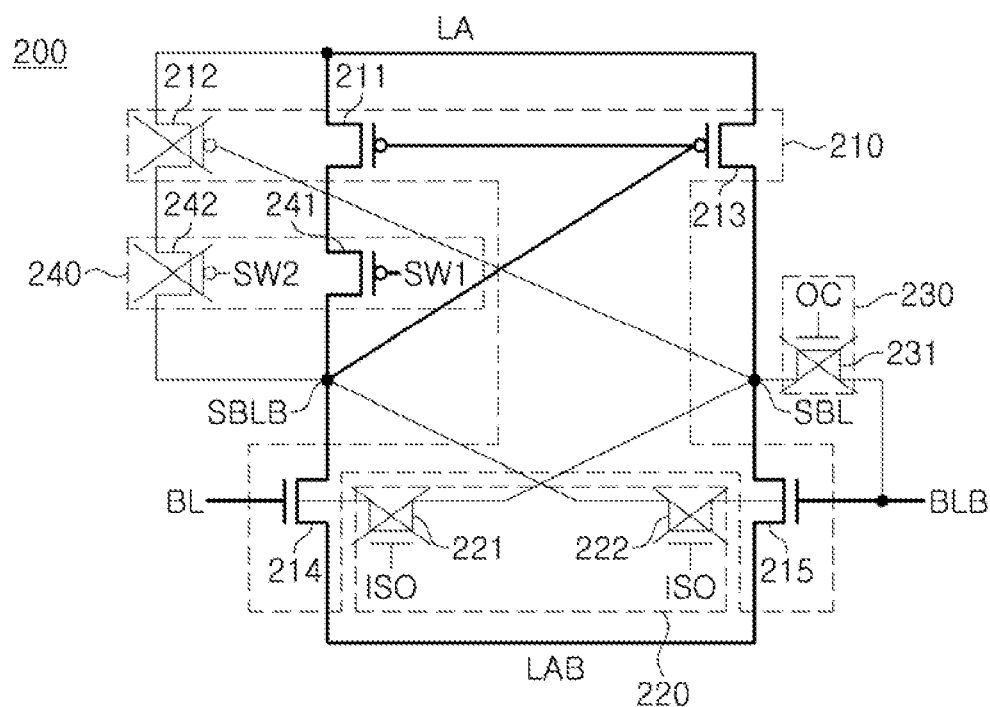
Figure 10:
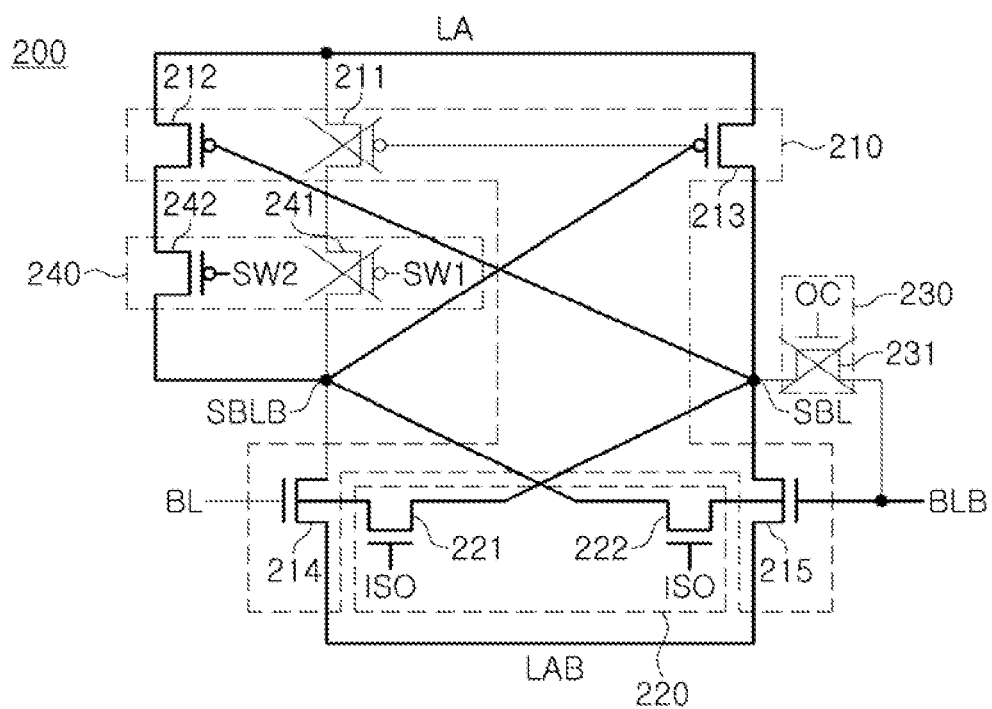

FIGS. 8 to 10 are diagrams illustrating an operation of a bit line sense amplifier according to an example embodiment.

FIG. 8 is a circuit diagram illustrating the bit line sense amplifier 200 activated while performing an offset cancellation operation. FIG. 9 is a circuit diagram illustrating the bit line sense amplifier 200 activated while performing a pre-sensing operation. FIG. 10 is a circuit diagram illustrating the bit line sense amplifier 200 activated while performing a restore operation.

The bit line sense amplifier 200 according to an example embodiment may sequentially perform a pre-charge operation, an offset cancellation operation, a charge sharing operation, a pre-sensing operation, and a restore operation to perform a read operation or a refresh operation.

The pre-charge operation may be a preparation operation before performing a read operation or a refresh operation. During the pre-charge operation, the bit line sense amplifier 200 may precharge the bit line BL, the complementary bit line BLB, the sensing bit line SBL, and the complementary sensing bit line SBLB with the pre-charge voltage VPRE.

While the bit line sense amplifier 200 performs a pre-charge operation, the isolation signal ISO and the offset cancellation signal OC may be logic high. Accordingly, the first isolation transistor 221, the second isolation transistor 222, and the offset cancellation transistor 231 may all be turned on. Accordingly, the bit line BL, the complementary bit line BLB, the sensing bit line SBL, and the complementary sensing bit line SBLB may be connected by one node, and may be charged with the pre-charge voltage VPRE. In this case, a first control signal LA and a second control signal LAB may be charged to the pre-charge voltage VPRE.

Referring to FIG. 8, the bit line sense amplifier 200 may perform an offset cancellation operation after completing the pre-charging operation. For example, during the offset cancellation operation, the isolation signal ISO may have a logic low level, and the offset cancellation signal OC may have a logic high level. Accordingly, the first isolation transistor 221 and the second isolation transistor 222 may be turned off, and the offset cancellation transistor 231 may be turned on.

During the offset cancellation operation, the first control signal LA may be a first power voltage, and the second control signal LAB may be a second power voltage. For example, the first power voltage may be an internal power voltage supplied to the memory cell array, and the second power voltage may be a ground voltage.

In the bit line sense amplifier 200, the threshold voltages of the first transistor 211 and the third transistor 213, and the threshold voltages of the fourth transistor 214 and the fifth transistor 215 may be different from each other due to factors such as process variation and temperature. The bit line sense amplifier 200 according to an example embodiment may compensate for offset noise generated due to a difference in threshold voltages of transistors, by an offset cancellation operation.

For example, a predetermined voltage difference may occur between the bit line BL and the complementary bit line BLB of the bit line sense amplifier 200 due to the threshold voltage difference between the transistors. This predetermined voltage difference may be interpreted as an offset voltage according to the offset noise, and the bit line sense amplifier 200 may compensate for the offset noise by detecting the offset voltage in advance in the offset cancellation operation.

Referring to FIG. 9, the bit line sense amplifier 200 may perform a charge sharing operation and a pre-sensing operation, after completing the offset cancellation operation.

While the charge sharing operation and the pre-sensing operation are performed, both the isolation signal ISO and the offset cancellation signal OC may be logic low, such that the first isolation transistor 221, the second isolation transistor 222, and the offset cancellation transistor 231 may all be turned off.

During the charge sharing operation, the word line WL connected to the memory cell is activated, and charge sharing may occur between the charge stored in the cell capacitor of the memory cell and the charge stored in the bit line BL.

For example, when data '1' is stored in the memory cell, the voltage level of the bit line BL may increase by a predetermined level due to the charge sharing operation. Conversely, when data '0' is stored in the memory cell, the voltage level of the bit line BL may drop by a predetermined level due to the charge sharing operation. In detail, the voltage of the bit line BL may increase or decrease by a predetermined level ΔV according to data stored in the memory cell by the charge sharing operation.

On the other hand, during the charge sharing operation, the first control signal LA and the second control signal LAB may transition to the pre-charge voltage VPRE. In the pre-sensing operation (after completing the charge sharing operation), the first control signal LA may transition back to the internal power voltage, and the second control signal LAB may also transition back to the ground voltage.

Accordingly, the bit line sense amplifier 200 according to an example embodiment performs the sensing bit line SBL based on the voltage difference between the bit line BL and the complementary bit line BLB while performing the pre-sensing operation. Each of the voltages of the over-complementary sensing bit line SBLB may be charged to an internal power voltage or discharged to a ground voltage.

For example, when data '1' is stored in the memory cell, the voltage level of the sensing bit line SBL may increase to the internal power voltage by the pre-sensing operation, and the voltage level of the complementary sensing bit line SBLB may be dropped to the ground voltage. Conversely, when data '0' is stored in the memory cell, the voltage level of the sensing bit line SBL may drop to the ground voltage due to the pre-sensing operation, and the voltage level of the complementary sensing bit line SBLB may rise to the internal power voltage level.

During the pre-sensing operation, the bit line BL and the complementary bit line BLB, and the sensing bit line SBL and the complementary sensing bit line SBLB, may be blocked from each other, as the first isolation transistor 221, the second isolation transistor 222, and the offset cancellation transistor 231 are turned off.

Referring to FIGS. 8 and 9 together, the bit line sense amplifier 200 may turn on the first selection transistor 241

(which is connected to the first transistor 211) while performing the offset cancellation operation, the charge sharing operation, and the pre-sensing operation, and may turn off the second selection transistor 242 (which is connected to the second transistor 212). Accordingly, the bit line sense amplifier 200 may operate as a differential amplifier.

Referring to FIG. 10, after completing the pre-sensing operation, the bit line sense amplifier 200 according to an example embodiment may perform a restore operation. For example, during the restore operation, the isolation signal ISO may be logic high, and the offset cancellation signal OC may be logic low.

Accordingly, the first isolation transistor 221 and the second isolation transistor 222 may be turned on, and the offset cancellation transistor 231 may be turned off. As the first isolation transistor 221 is turned on, the bit line BL and the sensing bit line SBL may be connected, and as the second isolation transistor 222 is turned on, the complementary bit line BLB and the complementary sensing bit line SBLB may be connected. The voltage level of the bit line BL may increase or decrease to the voltage level of the sensing bit line SBL, and the voltage level of the complementary bit line BLB may increase or decrease to the voltage level of the complementary sensing bit line SBLB.

On the other hand, the bit line sense amplifier 200 may turn off the first selection transistor 241 connected to the first transistor 211 while performing the restore operation, and may turn on the second selection transistor 242 connected to the second transistor 212. Accordingly, the bit line sense amplifier 200 may operate as a latch circuit.

The sensing bit line SBL and the complementary sensing bit line SBLB of the bit line sense amplifier 200 may be connected to a data line after the pre-sensing operation, and may output data to a local sense amplifier, a global sense amplifier, or an input/output buffer through the data line.

As described above, the bit line sense amplifier 200 according to an example embodiment may perform the pre-charge operation, the offset cancellation operation, the charge sharing operation, the pre-sensing operation, and the restore operation based on the isolation signal ISO, the offset cancellation signal OC, the first control signal LA, and the second control signal LAB.

The bit line sense amplifier 200 uses the first transistor 211, the second transistor 212, the first selection transistor 241, and the second selection transistor 242, such that the structure of the bit line sense amplifier 200 may be switched depending on operations, thereby preventing a capacitance imbalance at the edge of the memory cell array without using a dummy memory block.

In addition, by using the layout of the bit line sense amplifier 300 according to the example embodiment described with reference to FIGS. 5 to 7, a capacitance imbalance may be prevented without increasing a process difficulty.

Figure 11:
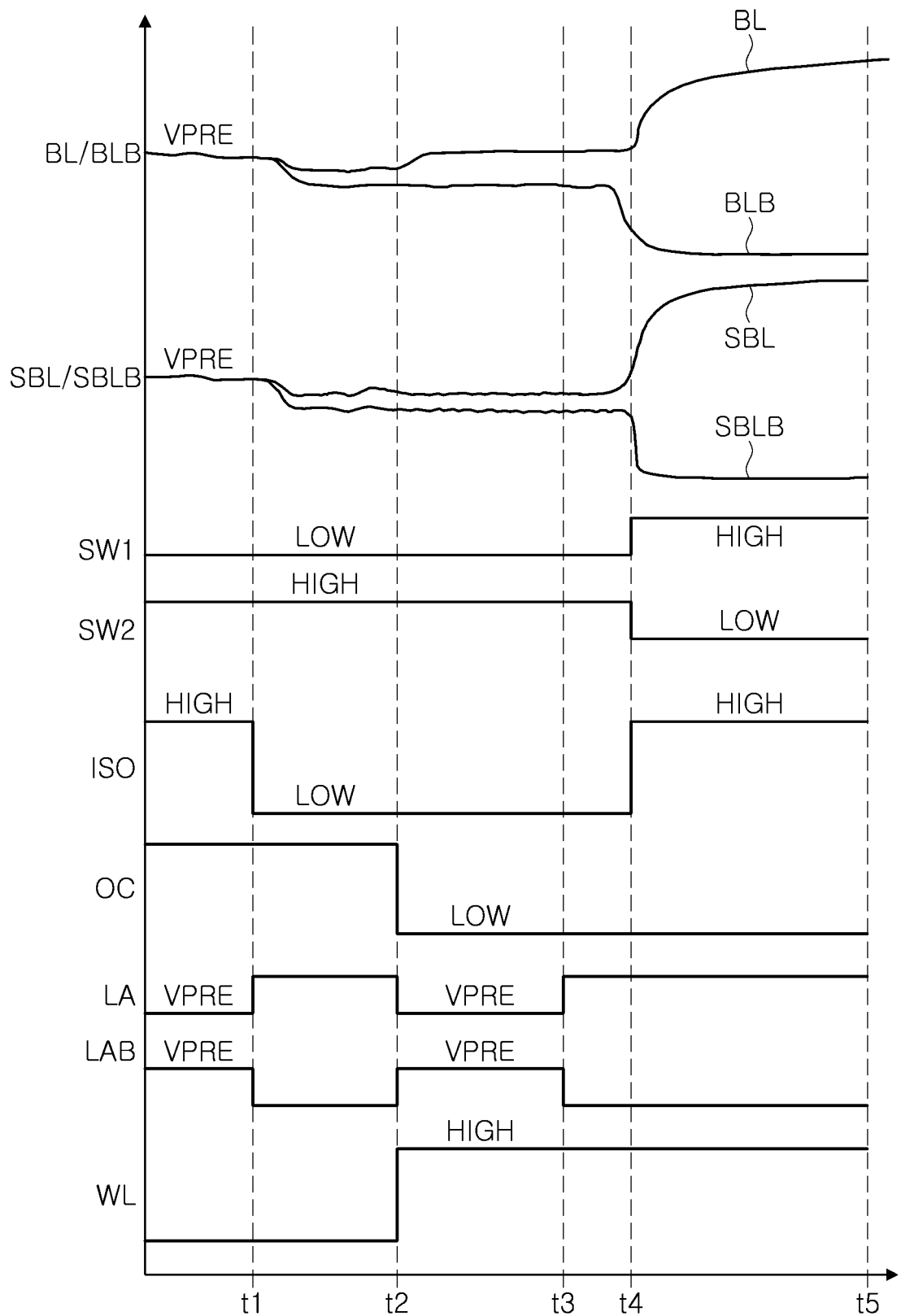
FIG. 11 is a diagram illustrating an operation of a bit line sense amplifier according to an example embodiment.

FIG. 11 is a diagram illustrating an operation of a bit line sense amplifier according to an example embodiment.

Referring to FIG. 11, the bit line sense amplifier 200 according to an example embodiment may sequentially perform a pre-charge operation, an offset cancellation operation, a charge sharing operation, a pre-sensing operation, and a restore operation. The operation of the bit line sense amplifier 200 in respective sections may correspond to the description of FIGS. 8 to 10.

The X axis of FIG. 11 indicates time t, and the Y axis indicates a signal level.

The signal change illustrated in FIG. 11 is an example of a case in which data '1' is stored in the memory cell, and the threshold voltage of the fourth transistor 214 is higher than the threshold voltage of the fifth transistor 215.

In a first section from t0 to t1, the bit line sense amplifier 200 may perform a pre-charge operation. As described above, during the pre-charge operation, the isolation signal ISO and the offset cancellation signal OC may be logic high. The bit line sense amplifier 200 may operate as a differential amplifier by activating a first sense amplifier select signal SW1 and deactivating a second sense amplifier select signal SW2.

In this case, the first bit line BL, the complementary bit line BLB, the sensing bit line SBL, and the complementary sensing bit line SBLB may be pre-charged with the pre-charge voltage VPRE.

In a second section from t1 to t2, the bit line sense amplifier 200 may perform an offset cancellation operation. As described above, while the offset cancellation operation is performed, the isolation signal ISO may be at a logic low level, and the offset cancellation signal OC may be at a logic high level. The bit line sense amplifier 200 may operate as a differential amplifier by activating the first sense amplifier select signal SW1 and maintaining the inactive state of the second sense amplifier select signal SW2.

In this case, the first control signal LA may increase from the pre-charge voltage VPRE to the internal power voltage, and the second control signal LAB may decrease from the pre-charge voltage VPRE to the ground voltage.

While the bit line sense amplifier 200 performs the offset cancellation operation, the voltage level of the bit line BL may be higher (by the amount of the offset voltage) than the voltage level of the complementary bit line BLB. Accordingly, the bit line BL and the complementary bit line BLB are stored to have a difference by the offset voltage, and thus, offset noise of the bit line sense amplifier 200 may be eliminated.

In a third period from t2 to t3, the bit line sense amplifier 200 may perform a charge sharing operation. As described above, during the charge sharing operation, the isolation signal ISO and the offset cancellation signal OC may be logic low. The bit line sense amplifier 200 may operate as a differential amplifier by activating the first sense amplifier select signal SW1 and maintaining the inactive state of the second sense amplifier select signal SW2.

At this time, the word line WL connected to the memory cell may be activated, and charge sharing may occur between the charge stored in the cell capacitor of the memory cell and the charge stored in the bit line BL. The voltage of the bit line BL may increase or decrease by a predetermined level according to data stored in the memory cell by the charge sharing operation.

In a fourth section from t3 to t4, the bit line sense amplifier 200 may perform a pre-sensing operation. As described above, during the pre-sensing operation, the isolation signal ISO and the offset cancellation signal OC may be logic low. The bit line sense amplifier 200 may operate as a differential amplifier by activating the first sense amplifier select signal SW1 and maintaining the inactive state of the second sense amplifier select signal SW2.

In this case, the first control signal LA may transition to the internal power voltage, and the second control signal LAB may transition to the ground voltage. Accordingly, the bit line sense amplifier 200 may increase the voltage level of the sensing bit line SBL to an internal power voltage, based on the voltage difference between the bit line BL and the complementary bit line BLB, and may drop the voltage level of the complementary sensing bit line SBLB to the ground voltage.

In a fifth section from t4 to t5, the bit line sense amplifier 200 may perform a restore operation. As described above, during the restore operation, the isolation signal ISO may be at a logic high level, and the offset cancellation signal OC may be at a logic low level. The bit line sense amplifier 200 may operate as a latch circuit by inactivating the first sense amplifier select signal SW1 and activating the second sense amplifier select signal SW2.

In this case, the bit line BL and the complementary bit line BLB, and the sensing bit line SBL and the complementary sensing bit line SBLB, may be connected to each other, and the voltage levels of the bit line BL and the complementary bit line BLB may be charged or discharged to the voltage levels of the sensing bit line SBL and the complementary sensing bit line SBLB.

Figure 12:
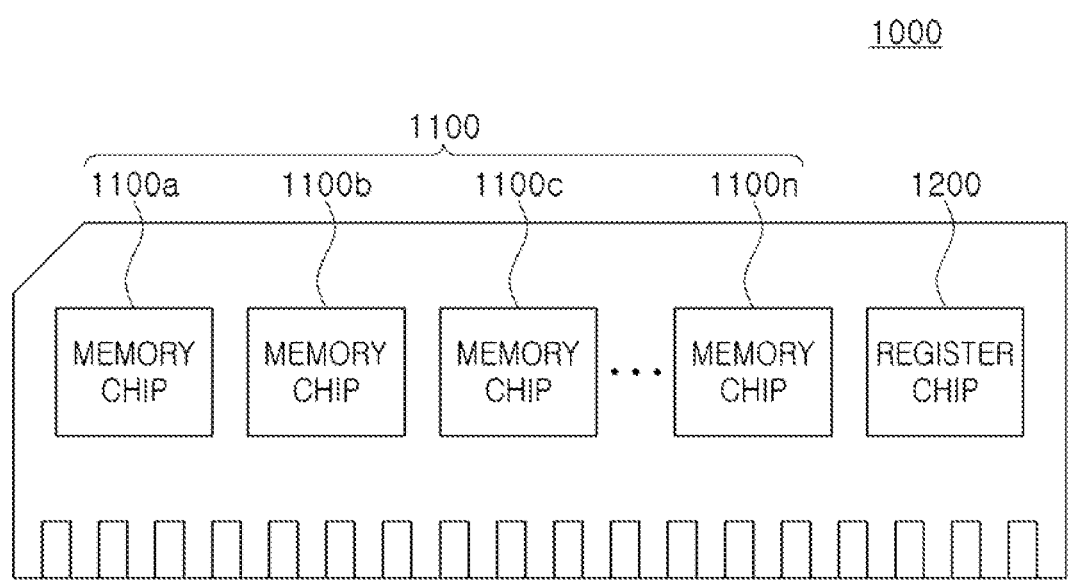
FIG. 12 is a view illustrating a memory module including a semiconductor memory device according to an example embodiment.

FIG. 12 is a drawing illustrating a memory module including a semiconductor memory device according to an example embodiment.

Referring to FIG. 12, a memory module 1000 may include a plurality of memory chips 1100*a*, 1100*b*, 1100*c*, ..., and 1100*n*, and a register chip 1200. The plurality of memory chips 1100*a*, 1100*b*, 1100*c*, ..., and 1100*n* may include the semiconductor memory device 10 illustrated in FIG. 1.

The plurality of memory chips 1100*a*, 1100*b*, 1100*c*, ..., and 1100*n* may receive a command, an address, data, and the like from an external device, such as a host, a memory controller, an AP, and the like, and may perform a read operation and/or a write operation of the data. The register chip 1200 may receive a command or a control signal from an external device, and store mode register set (MRS) information based on the received command or control signal, or the like.

Each of the plurality of memory chips 1100*a*, 1100*b*, 1100*c*, ..., and 1100*n* may include the bit line sense amplifiers described with reference to FIGS. 2 to 11. For example, each of the plurality of memory chips 1100*a*, 1100*b*, 1100*c*, ..., and 1100*n* may be the semiconductor memory device 20 illustrated in FIG. 3. Accordingly, the plurality of memory chips 1100*a*, 1100*b*, 1100*c*, ..., and 1100*n* may prevent a capacitance imbalance without dummy memory blocks and/or capacitor blocks, while maintaining an existing process, i.e., without increasing process difficulty.

By way of summation and review, in a DRAM, a memory cell array may include a plurality of memory cells connected to a bit line and a complementary bit line. The DRAM may operate by writing data by storing electric charges in capacitors of each of the plurality of memory cells. When a read operation or a refresh operation is performed in the DRAM, a sense amplifier may sense and amplify a voltage difference between the bit line and the complementary bit line, thereby outputting digital data stored in the memory cell.

As set forth above, in a bit line sense amplifier according to an example embodiment, by additionally connecting transistors that enable the bit line sense amplifier to selectively operate as a differential amplifier and a latch, a loading or capacitance imbalance (which may be present in a semiconductor memory device that does not include a dummy memory block at the edge of a memory cell array) may be prevented.

In the bit line sense amplifier according to an example embodiment, a wiring pattern may be formed without increasing a difficulty of a process, by using a layout structure in which a sensing transistor and a selection transistor are connected.

Example embodiments may provide a bit line sense amplifier in which a loading imbalance (which may occur when a sense amplifier operates in a semiconductor memory device that does not include a dummy memory cell at an edge of a memory cell array) may be prevented, and an operation method thereof.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A bit line sense amplifier, comprising:
a sensing amplification unit configured to sense a voltage difference between a bit line and a complementary bit line, and to adjust voltages of a sensing bit line and a complementary sensing bit line based on the sensed voltage difference;
an isolation unit including a first isolation transistor connected to the bit line and the sensing bit line, and controlled by an isolation signal, and including a second isolation transistor connected between the complementary bit line and the complementary sensing bit line, and controlled by the isolation signal;
an offset cancellation unit including an offset cancellation transistor connected between the complementary bit line and the sensing bit line, and controlled by an offset cancellation signal; and
a transistor selection unit including a first selection transistor and a second selection transistor connected to the complementary sensing bit line, and controlled to be complementarily turned on and off in response to a first sense amplifier select signal and a second sense amplifier select signal, wherein:
the sensing amplification unit includes:
a first transistor connected to the first selection transistor, and controlled by a voltage change of the complementary sensing bit line; and
a second transistor connected to the second selection transistor, and controlled by a voltage change of the sensing bit line.

2. The bit line sense amplifier as claimed in claim 1, wherein the second selection transistor is configured to turn on in response to the second sense amplifier select signal while the offset cancellation transistor is turned off and the first isolation transistor and the second isolation transistor are turned on.

3. The bit line sense amplifier as claimed in claim 1, wherein the first transistor and the second transistor share a first node to which a first control signal is applied.

4. The bit line sense amplifier as claimed in claim 1, wherein the sensing amplification unit further includes a third transistor connected between the sensing bit line and a first node to which a first control signal is applied, and controlled by the voltage change of the complementary sensing bit line.

5. The bit line sense amplifier as claimed in claim 4, wherein the sensing amplification unit further includes:

a fourth transistor connected between the complementary sensing bit line and a second node to which a second control signal is applied, and controlled by a voltage change of the bit line; and a fifth transistor connected between the sensing bit line and the second node, and controlled by a voltage change of the complementary bit line.

6. The bit line sense amplifier as claimed in claim 5, wherein a magnitude of the first control signal applied to the first node is less than a magnitude of the second control signal applied to the second node.

7. The bit line sense amplifier as claimed in claim 5, wherein:

the first selection transistor, the second selection transistor, the first transistor, and the second transistor are PMOS transistors, and the fourth transistor and the fifth transistor are NMOS transistors.

* * * * *